(12) United States Patent
Lee et al.

(10) Patent No.: US 11,797,052 B2
(45) Date of Patent: Oct. 24, 2023

(54) INFORMATION HANDLING SYSTEM ZERO BEZEL DISPLAY

(71) Applicant: Dell Products L.P., Round Rock, TX (US)

(72) Inventors: Jongseo Lee, Austin, TX (US); Duck Soo Choi, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 420 days.

(21) Appl. No.: 16/938,134

(22) Filed: Jul. 24, 2020

(65) Prior Publication Data

US 2022/0026952 A1  Jan. 27, 2022

(51) Int. Cl.
| | | |
|---|---|---|
| G06F 1/16 | (2006.01) | |
| G02F 1/1333 | (2006.01) | |
| H05K 5/00 | (2006.01) | |
| H10K 50/84 | (2023.01) | |
| H10K 50/858 | (2023.01) | |
| H10K 59/12 | (2023.01) | |
| H10K 71/00 | (2023.01) | |
| H10K 77/10 | (2023.01) | |
| H10K 101/00 | (2023.01) | |
| H10K 102/00 | (2023.01) | |

(52) U.S. Cl.
CPC ...... *G06F 1/1637* (2013.01); *G02F 1/133308* (2013.01); *H05K 5/0017* (2013.01); *H10K 50/841* (2023.02); *H10K 50/858* (2023.02); *H10K 59/12* (2023.02); *H10K 71/00* (2023.02); *H10K 77/111* (2023.02); *G02F 1/133331* (2021.01); *H10K 2101/80* (2023.02); *H10K 2102/311* (2023.02)

(58) Field of Classification Search
CPC ............. H01L 27/3244; H01L 51/0097; H01L 51/524; H01L 51/5275; H01L 51/56; H01L 2251/5338; H01L 2251/5346; H01L 51/5237; G02F 1/133308; G02F 1/133331; G06F 1/1637; H05K 5/0017; Y02E 10/549
See application file for complete search history.

(56) References Cited

U.S. PATENT DOCUMENTS

| | | |
|---|---|---|
| 7,167,309 B2 | 1/2007 | Saxena et al. |
| 7,924,362 B2 | 4/2011 | Slobodin |
| 9,588,264 B2 | 3/2017 | Etienne et al. |
| 10,236,474 B2 * | 3/2019 | Song .................. H01L 51/56 |
| 2005/0142382 A1 * | 6/2005 | Menda ............... H01L 51/5259 |
| | | 428/917 |

(Continued)

FOREIGN PATENT DOCUMENTS

JP  5020383 B2  9/2012

*Primary Examiner* — Kevin Quarterman
(74) *Attorney, Agent, or Firm* — ZAGORIN CAVE LLP; Robert W. Holland

(57) ABSTRACT

An information handling system display with zero bezel defines a perimeter with a square side of a cover glass having a curved interior surface and a gradient refractive index portion that focuses visual images from a folded display film to a flat upper surface of the cover glass. The folded display film provides a display image across a full length of the cover glass while fitting under the cover glass with the fold and presenting undistorted visual images through the lens focus provided by the gradient refractive index portion.

7 Claims, 4 Drawing Sheets

(56) References Cited

U.S. PATENT DOCUMENTS

| | | | |
|---|---|---|---|
| 2010/0164920 A1* | 7/2010 | Shimoharada | G09G 5/14 345/207 |
| 2013/0242230 A1* | 9/2013 | Watanabe | G02F 1/133504 349/64 |
| 2013/0258234 A1* | 10/2013 | Park | G02F 1/133528 349/58 |
| 2016/0370644 A1* | 12/2016 | Wang | G02F 1/1368 |
| 2017/0045771 A1* | 2/2017 | Choi | H01L 27/3258 |
| 2017/0311466 A1* | 10/2017 | Memering | C03C 21/003 |
| 2018/0040847 A1* | 2/2018 | Lee | H01L 51/5237 |
| 2020/0083490 A1* | 3/2020 | Zhang | H01L 51/56 |

* cited by examiner

INFORMATION HANDLING SYSTEM ZERO BEZEL DISPLAY

BACKGROUND OF THE INVENTION

Field of the Invention

The present invention relates in general to the field of information handling system displays, and more particularly to an information handling system zero bezel display.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Typically, portable information handling systems are built around a display size. Generally, a display integrates into one face of the housing so that the end user display size selection defines the housing size. In addition, integration of a display in a housing typically involves a structure that expands past the viewing area of the display in order to provide support to hold the display associated cables and electronics. Often, the display viewing area is framed with a bezel that covers the perimeter of the display to protect and hide these cables and electronics. Generally, manufacturers attempt to narrow the size of the bezel so that an end user views a display viewing area as large as possible with minimal housing size. Similarly, peripheral displays also typically attempt to minimize bezel size so that a peripheral display consumes as little desktop space as possible.

Recently, display films have been introduced that bend and fold. For instance, organic light emitting diode (OLED) displays have a display film that bends and can conform to support having a bend. Some portable information handling systems have been developed that use and OLED display film with a plastic substrate to support folding of a display along a rotational axis between housing portions. In addition, OLED display films have been used in peripheral display devices that have a curved front surface about a central axis so that the edges of the display center about an end user's viewing angle to offer a constant viewing angle for the user. Liquid crystal display films that bend also support such curved displays. Although these curved displays can provide improved viewing angles, they generally still include a bezel around the display perimeter.

SUMMARY OF THE INVENTION

Therefore, a need has arisen for a system and method which provides a display having a zero bezel edge.

In accordance with the present invention, a system and method are provided which substantially reduce the disadvantages and problems associated with previous methods and systems for integrating a display in a housing with a minimal bezel. A glass cover disposed over a display film forms the perimeter of a display and presents visual images to the perimeter with an integrated gradient refractive index portion that focus visual images from a folded underlying display film to the glass cover upper surface.

More specifically, an information handling system processes information with processing components disposed in a housing, such as central processing unit and a memory, and presents the information as visual images at a display integrated in the housing. For instance, visual images are created at a display film having pixels that define a visual image by illumination at a color defined by pixel values communicated from a graphics processor. A cover glass over display film defines the perimeter of the display along opposing vertical sides with a cubed or square edge. In order to present the visual image across the entire glass surface, the end of the display film folds away from the upper surface of the glass cover to accommodate an increased length, such as a length of substantially that of the cover glass. The folded portion of the display film illuminates into a gradient refractive index portion of the cover glass that focuses the visual image towards the cover glass upper surface to present the visual image in an undistorted manner to the end of the cover glass.

The present invention provides a number of important technical advantages. One example of an important technical advantage is that a true zero bezel display is provided with the edge of the display having a cover glass square corner that provides the edge of information handling system. Visual images are presented across the length of the cover glass between the opposing sides so that the footprint of the display is efficiently used and the end user has a full view of visual images without disruption by a side bezel. The display has a clean cube appearance that is both practical and aesthetically appealing. Although example embodiment depicts a convertible portable information handling system, the cubed display with square edges and full display area visual image presentation may be used with a tablet planar housing configuration or in a peripheral display.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system display has a zero bezel cover glass with a square edge that directs visual images to a front surface with a gradient refractive index portion. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
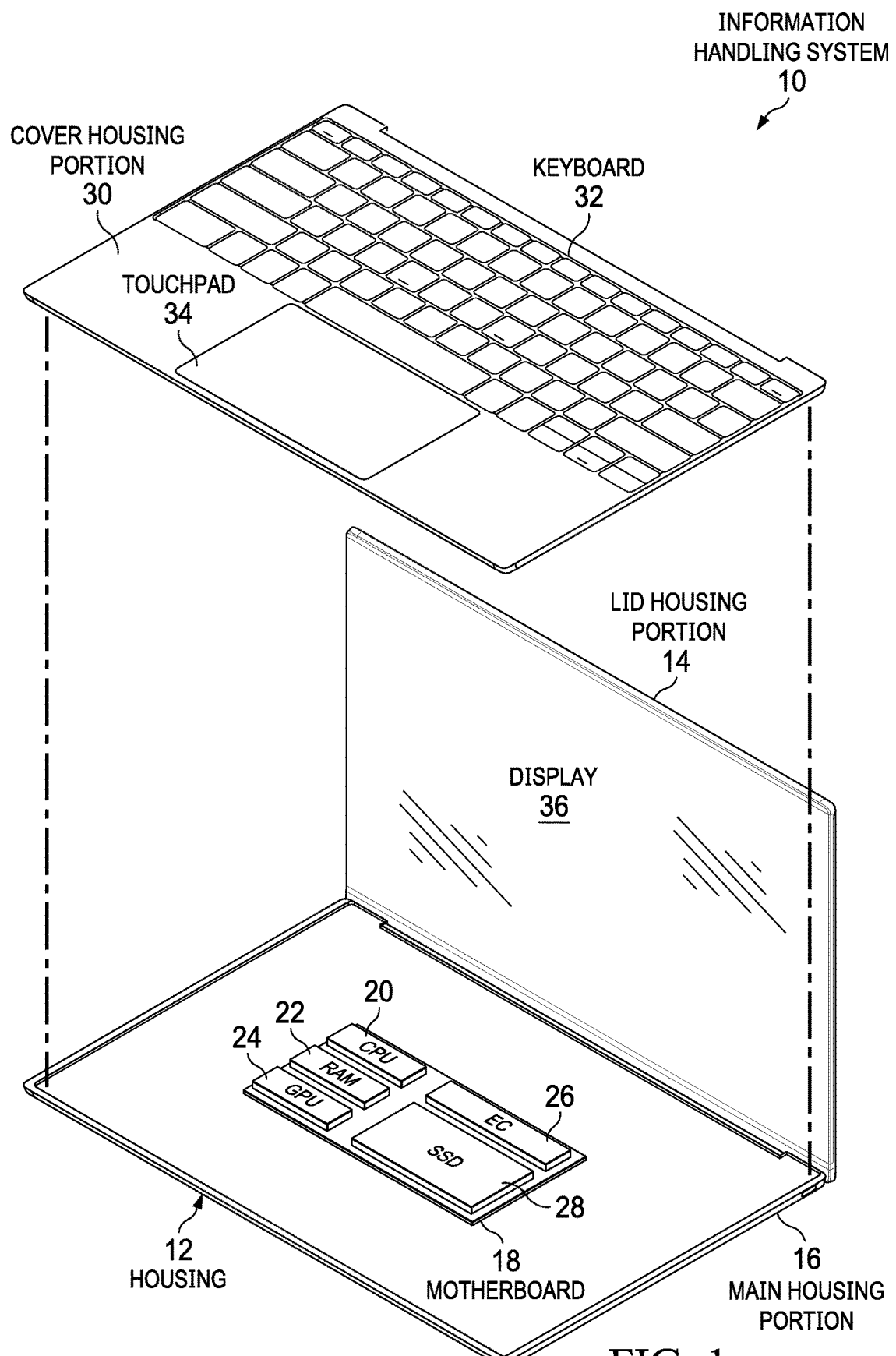
FIG. 1 depicts a front perspective exploded view of an information handling system have a zero bezel square cover glass perimeter at opposing sides.

Referring now to FIG. 1, a front perspective exploded view depicts an information handling system 10 having a zero bezel square cover glass perimeter at opposing sides. In the example embodiment, information handling system 10 has a portable housing 12 with a lid housing portion 14 rotationally coupled to a main housing portion 16 by a hinge to support rotation between closed and open positions, such as the clamshell position depicted by FIG. 1. Processing components disposed in main housing portion 16 cooperate to process information. For example, a motherboard 18 interfaces a central processing unit (CPU) 20 that executes instructions to process information with a random access memory (RAM) 22 that stores the instructions and information. For instance, the instructions include an operating system and applications stored in non-transitory memory of a solid state drive (SSD) 28 that are retrieved by CPU 20 and RAM 22 at power up. A graphics processor unit (GPU) 24 interfaces with CPU 20 and further processes information to define visual images for presentation at a display 36, such as defining pixel values for colors presented at pixels of a pixel lay in display 36. An embedded controller 26 manages operating conditions of physical components, such as application of power and thermal transfer resources, and interactions with input devices, such as a keyboard 32 and touchpad 34 supported over the processing components by a cover housing portion 30.

Display 36 has a zero bezel at opposing vertical sides that presents visual images to the perimeter at the opposing sides. As described below in greater detail, the upper and lower sides of display 36 have a frame at the perimeter that provides a bezel structure, although alternative embodiments may extend the zero bezel about the full perimeter of display 36. To achieve full presentation of visual images at the opposing sides, a display film within display 36 folds under and away from the front surface of the cover glass of display 36 so that the length of the display film is substantially the length between the opposing sides. The visual image is presented along the opposing sides in an undistorted manner by integrating a gradient refractive index portion that focuses the visual image from the folded portion of the display film for presentation at the cover glass surface. Although the example embodiment depicts a single display 36 in lid housing portion 14, an alternative embodiment may include a dual display configuration having a second display integrated in the places of keyboard 32.

Figure 2:
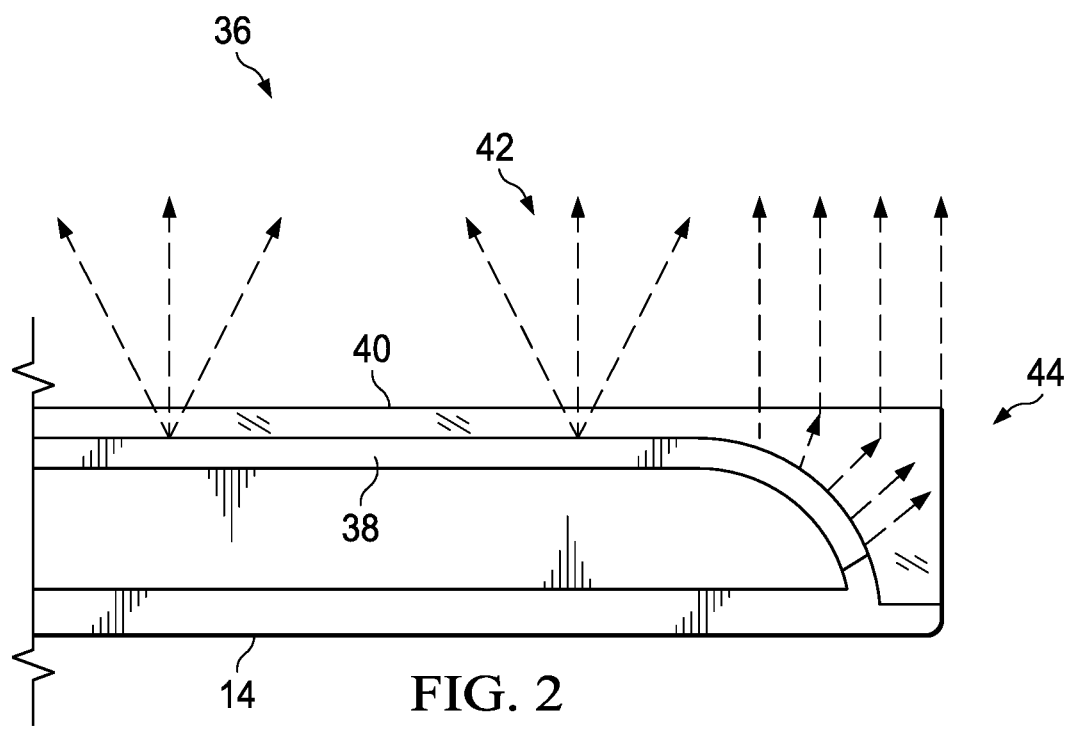
FIG. 2 depicts a side cutaway view of a display having a square cover glass perimeter that integrates a gradient refractive index portion.

Referring now to FIG. 2, a side cutaway view depicts display 36 having a square cover glass 40 perimeter that integrates a gradient refractive index portion 44. In the example embodiment, a plastic organic light emitting diode (POLED) display film 38 is supported over lid housing portion 14 to fold away from the upper surface of cover glass 40 proximate to the perimeter. POLED display film 38 folds along an inner curved circumference of cover glass 40 at gradient refractive index portion 44 and may be coupled to the inner surface of cover glass 40 with an optically clear adhesive or placed with an air gap. Folding or bending the end of POLED display film 38 allows for a length of display film that would substantially reach the perimeter of cover glass 40 if laid flat. As the orientation of POLED display film 38 changes along the curved inner surface at gradient refractive index portion 44, light proceeding from the display film pixels is redirected towards the upper surface of cover glass 40 with a lens focus provided by gradient refractive index portion 44 with net effect of presenting visual images from POLED display film 38 at the upper surface of cover glass 40 as if POLED display film 38 were laid flat. The light path arrows 42 depict the lens focus effect provided by gradient refractive index portion 44. To achieve the refraction index for the desired lens, gradient refractive index portion 44 may be treated in a variety of ways. For example, chemical vapor deposition deposits layers of glass having varying refractive indexes to produce a cumulative refractive change. As an alternative, glass is immersed in a liquid melt with lithium ions that diffuse to impregnate the glass and replace sodium ions to create a gradient material structure with the desired lens effect so that the visual image presented along the folded POLED display film 38 is undistorted at the upper surface of cover glass 40.

Figure 3:
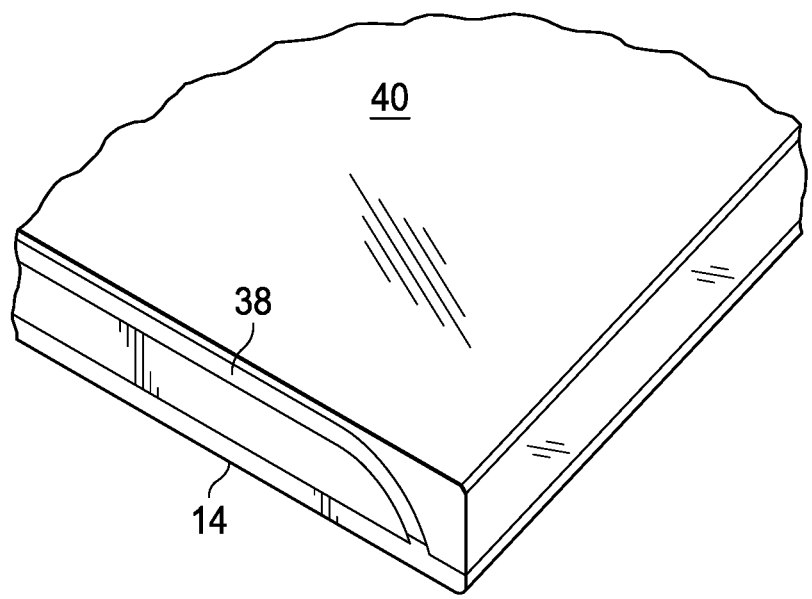
FIG. 3 depicts a side perspective view of a display corner having a zero bezel cover glass.

Referring now to FIG. 3, a side perspective view depicts a display corner having a zero bezel cover glass 40. POLED display film 38 folds to conform to an inner curved surface of cover glass 40 along one side of the display assembly. A gradient refractive index portion integrated in the cover glass presents the visual images provided by pixels of POLED display film 38 as an undistorted image that corresponds to the square outer corner of cover glass 40 so that the visual image as the effect of appearing as though POLED display film 38 is laid flat under cover glass 40. The bottom portion of the display meets against a frame to define the bottom perimeter of the displayed visual image. In an alternative embodiment, a fold may be included along the bottom portion or a top portion of cover glass 40 to provide a squared perimeter with the display film cut at the corner to provide a clean fold. Although the example embodiment depicts a folded POLED display film, in an alternative embodiment, a liquid crystal display film may be used. The square perimeter of cover glass 40 may include some reduction at the corner to have a less sharp edge as desired where the decrease in the corner edge is small enough to avoid any substantial impact of the image presented at the cover glass perimeter.

Figure 4:
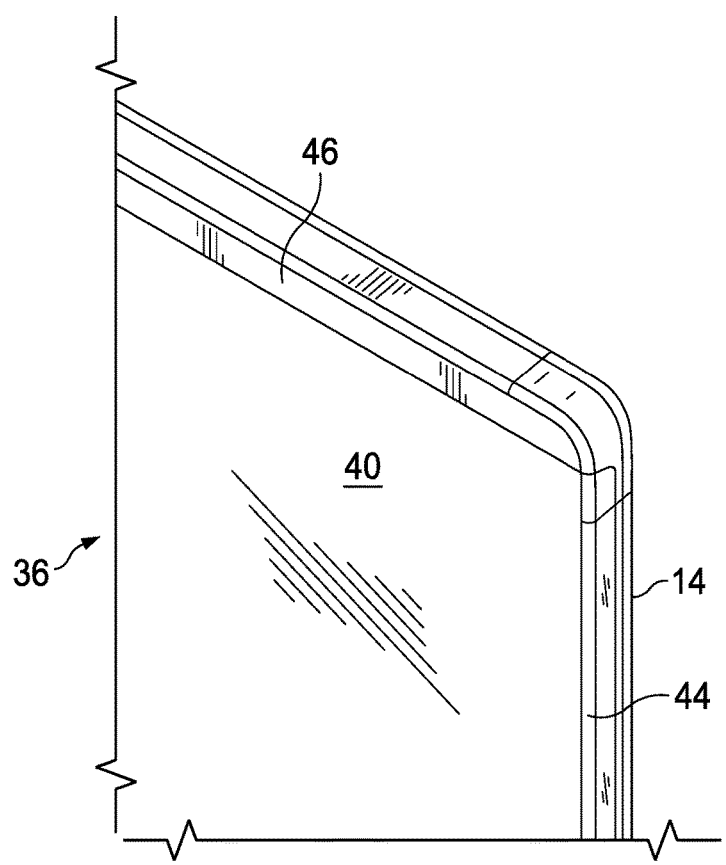
FIG. 4 depicts an upper perspective view of the zero bezel cover glass display integrated in an information handling system housing.
Figure 5:
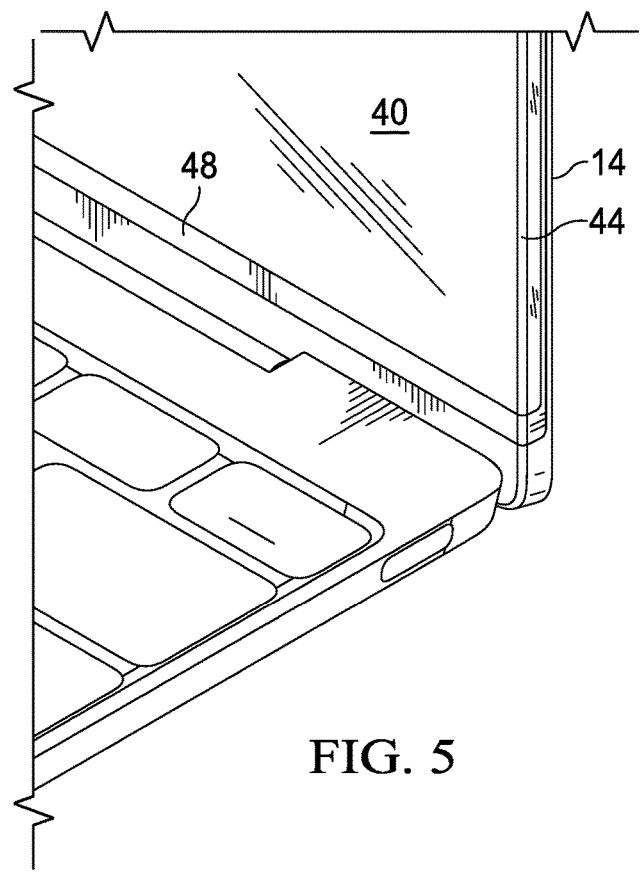
FIG. 5 depicts a lower perspective view of the zero bezel cover glass display integrated in an information handling system housing.
Figure 6:
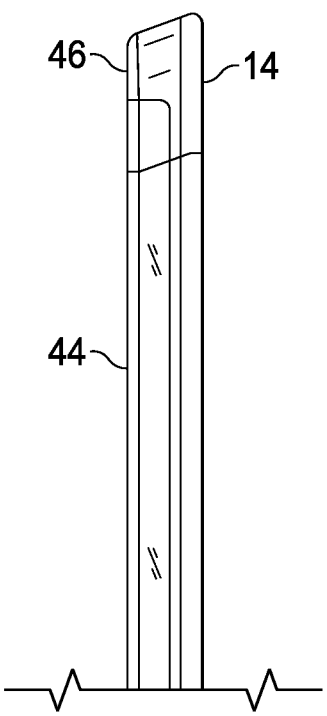
FIG. 6 depicts an upper side view of the zero bezel cover glass display integrated in an information handling system housing.
Figure 7:
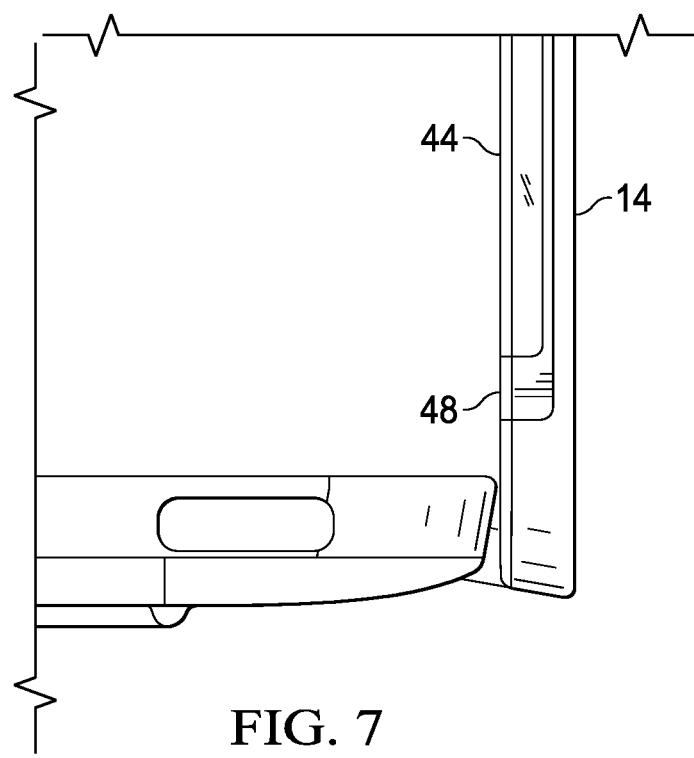
FIG. 7 depicts a lower side view of the zero bezel cover glass display integrated in an information handling system housing.

Referring now to FIGS. 4 through 7, various views of information handling system 10 depicts integration of display 36 into a portable information handling system housing lid portion. FIG. 4 depicts an upper perspective view of display 36 having a cover glass 40 with a square perimeter that integrates a gradient refractive index portion 44 to present visual images to the edge of cover glass 40. A frame 46 couples at the upper side of cover glass 40 to couple display 36 in lid housing portion 14. Frame 46 defines the viewing area of display 36 along the upper perimeter while cover glass 40 extends along and down the side perimeter to meet against lid housing portion 14 and define a zero bezel with cover glass 40 disposed at the side surface. FIG. 5 depicts a lower perspective view having a lower frame 48 coupled at the bottom perimeter of cover glass 40 to define the viewing area at the bottom of display 36. FIG. 6 depicts a side view of display 36 with upper frame 46 coupled to lid housing portion 14 to define an upper intersection of the gradient refractive index portion 44, upper frame 46 and lid housing portion 14. FIG. 7 depicts the intersection of lower frame 48, cover glass 44 and lid housing portion 14. The effect is a zero bezel appearance with a glass corner edge and visual images presented to the edge of the display along opposing vertical sides. Although the example embodiment depicts integration in a portable information handling system housing, in alternative embodiments, the zero bezel display may be used in peripheral displays that present visual images in a housing separate from an information handling system.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to execute instructions that process information;
   a memory interfaced with the processor and operable to store the instructions and information; and
   a display integrated in the housing, the display having an organic light emitting diode (OLED) display film and a cover glass, the cover glass at opposing sides having a square outer corner integrating a gradient refractive index portion configured to refract light to a front face of the glass cover, the front face having a flat outer surface, the OLED display film having a flat central region with pixels of the OLED display film having planar disposition at a first distance from the flat outer surface and a curved region with pixels of the OLED display film having a curved disposition along at least a portion of a perimeter of the housing, the curved region increasing the distance of the pixels from the cover glass outer surface to a second distance at a perimeter of the OLED display film, the cover glass having a curved inner surface that conforms with the OLED display film pixels in the curved region.

2. The information handling system of claim 1 further comprising:
   an upper frame disposed at a perimeter of an upper side of the display; and
   a lower frame disposed at a lower perimeter of a lower side of the display;
   wherein the opposing sides define the outer perimeter of the display and housing.

3. The information handling system of claim 1 wherein the organic light emitting diode film folds away from the glass cover outer surface at each of the opposing sides.

4. The information handling system of claim 3 wherein the length of the organic light emitting diode film is substantially the length between the opposing sides.

5. The information handling system of claim 4 wherein the gradient refractive index portion comprises lithium ions impregnated in the glass cover.

6. The information handling system of claim 4 wherein the gradient refractive index portion comprises glass deposited with varying refractive indexes.

7. The information handling system of claim 6 wherein the housing comprises first and second portions, the display integrated in the first portion, a keyboard integrated in the second portion.

\* \* \* \* \*